US005851877A

United States Patent [19]

Ho et al.

[11] Patent Number: 5,851,877

[45] Date of Patent: Dec. 22, 1998

[54] METHOD OF FORMING A CROWN SHAPE CAPACITOR

[75] Inventors: Yu-Chun Ho, Taipei; Hsiang-Wei Tseng, Taichung, both of Taiwan

[73] Assignee: Vanguard International Semiconductor Corporation, Hsinchu, Taiwan

[21] Appl. No.: 3,301

[22] Filed: Jan. 6, 1998

[51] Int. Cl.[6] ........................ H01L 21/8242

[52] U.S. Cl. ........................ 438/253; 438/254

[58] Field of Search ........................ 438/250–256, 438/393–399, 238–240, 381

[56] References Cited

U.S. PATENT DOCUMENTS 5,399,518 3/1995 Sim et al. .

5,444,005 8/1995 Kim et al. .

*Primary Examiner*—Jey Tsai

*Attorney, Agent, or Firm*—Christensen, O'Connor, Johnson & Kindness PLLC

[57] ABSTRACT

An etching process is used to etch the polysilicon layer. Then, Polymers are formed on the polysilicon layer after an ash step is performed. An organic layer is formed on the surface of the polysilicon layer, and on the polymers. An anisotropically etch is carried out to etch the organic layer, thereby forming organic side wall spacers on the side walls of the polysilicon layer. The etching is continuously performed to etch the polysilicon layer using the polymers and organic side wall spacers as masks. Next, an ash and a RCA clean procedure are performed to remove the residual polymers and the organic layer. A dielectric layer is then deposited on the surface of the polysilicon. A conductive layer is deposited over the dielectric layer.

19 Claims, 4 Drawing Sheets

METHOD OF FORMING A CROWN SHAPE CAPACITOR

FIELD OF THE INVENTION

The present invention relates to a semiconductor capacitor, and more specifically, to a method of making a crown shape capacitor for DRAM cell.

BACKGROUND OF THE INVENTION

Dynamic Random Access Memory (DRAM) is primly applied in the field of computer industry for storing data. Indeed, a memory cell is provided for each bit stored by a DRAM device. Each memory cell typically consists of a storage capacitor and an access transistor. Thus, the formation of a DRAM memory cell comprises the formation of a transistor, a capacitor and contacts to external circuits.

With the advent of ultra large scale integrated circuits (ULSI), the sizes of memory cells have gotten smaller and smaller such that the area available for a single memory cell has become very small. This has caused a reduction in capacitor area, which in turn results in a reduction in cell capacitance. For very small memory cells, capacitor becomes very difficult to use reliably. Specifically, as the size of the capacitor decreases, the capacitance of the capacitor also decreases. For example, the amount of the charge capable of being stored by the capacitor decreases. This results in the capacitor being very susceptible to $\alpha$ particle interference. Additionally, the charge held by the capacitor must be refreshed often. Thus, this leads to the refresh frequency increase.

Prior art approaches to overcoming these problems have resulted in the development of the trench capacitor and the stacked capacitor. Further, a cylindrical capacitor using hemispherical grained silicon has been proposed (see "A NEW CYLIDRICAL CAPACITOR USING HEMISPHERICAL GRAINED Si FOR 256 Mb DRAMs", H. Watanabe et al., Tech Dig, Dec. 1992, pp.259–262). Reducing the thickness of the dielectric also can improve the capacitance of the capacitor, but this approach is limited because of yield and reliability problems associated with using very thin dielectric materials.

Crown shape capacitor has been extensively studied or used in the ULSI technology. However, the fabrication of the crown shape capacitor is not only complicated but the cost of making the capacitor is also high. The method of the present invention can achieve the crown shape capacitor with simple processes.

SUMMARY OF THE INVENTION

An etching process is used to etch the polysilicon layer using the photoresist as an etching mask. Then, an ash step is performed to the substrate. Polymers are formed on the patterned polysilicon layer. An wet etching step is optionally used to remove the polymers on the patterned polysilicon layer using RCA procedure. An organic layer, such as diluted photoresist or bottom anti-reflective coating (BARC), is formed on the surface of the polysilicon layer, and on the polymers. An anisotropically etch is carried out to etch the organic layer, thereby forming organic side wall spacers on the side walls of the patterned polysilicon layer. Then, the etching is continuously performed to etch the polysilicon layer using the polymers and organic side wall spacers as masks. Next, an ash and a RCA clean procedure are performed to remove the residual polymers and the organic layer. A dielectric layer is then deposited on the surface of the polysilicon. The dielectric layer is preferably formed of either a double film of nitride/oxide film, a triple film of oxide/nitride/oxide or any other high dielectric film such as tantalum oxide ($Ta_2O_5$), BST. A conductive layer is deposited using a conventional LPCVD process over the dielectric layer. The conductive layer provides a second storage electrode and is formed of doped polysilicon, in-situ doped polysilicon, aluminum, copper, tungsten or titanium.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A new method of forming a crown shape capacitor for a DRAM is disclosed herein. The formation of the capacitor described herein includes many process steps that are well known in the art. For example, the processes of lithography masking and etching are well known in the art and are used extensively herein without a related discussion of these well known technologies. In addition, the present invention uses residual polymer as an etching mask to form a crown shape capacitor structure. Further more, an organic film is also applied in the present invention for forming the structure.

Figure 1:
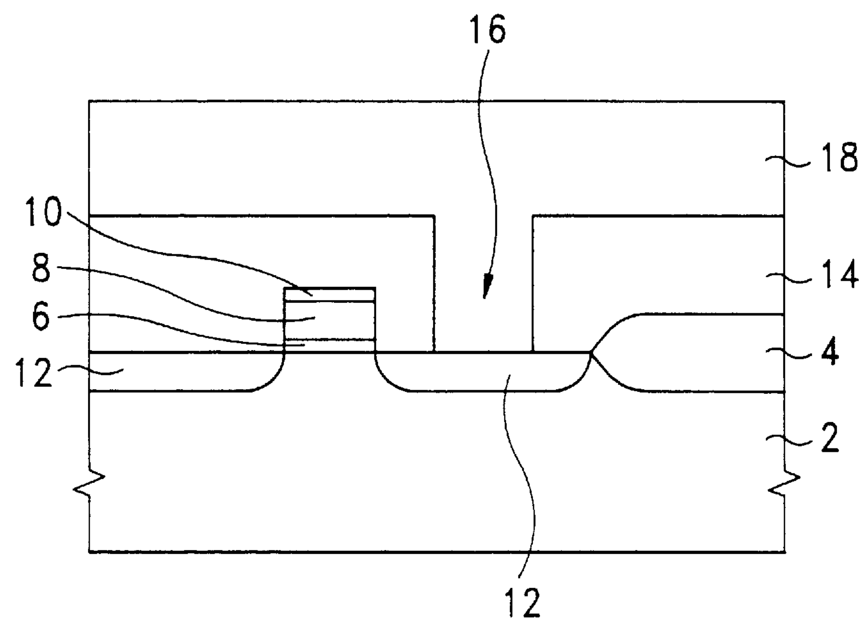
FIG. 1 is a cross section view of a semiconductor wafer illustrating the steps of forming gate structure, a first dielectric layer and a polysilicon layer on a semiconductor substrate according to the present invention.

In preferred embodiment, turning to FIG. 1, a single crystal silicon substrate 2 with a <100> crystallographic orientation, is provided. A thick field oxide (FOX) region 4 is formed to provide isolation between devices on the substrate. For example, the FOX region 4 can be formed via lithography and dry etching steps to etch a silicon nitride-silicon dioxide composition layer. Alternatively, a so called shallow trench isolation can be used to replace the FOX region 4.

Next, a silicon dioxide layer 6 is created on the top surface of the substrate to serve as the gate oxide. In one embodiment, the silicon dioxide layer is formed by using an oxygen-steam ambient, at a temperature of about 800°–1100° C. In this embodiment, the thickness of the silicon dioxide layer is approximately 30–200 angstroms.

A doped polysilicon layer 8 is then formed over the FOX region 4 and the silicon dioxide layer 6 using a low pressure chemical vapor deposition (LPCVD) process. A tungsten silicide layer or cap layer 10 may be formed on the first polysilicon layer 8. Next, standard photolithography and etching steps are used to form a gate structure. Subsequently, the source and the drain 12 are formed by using well known processes to implant appropriate impurities in those regions.

Turning to FIG. 1, a first dielectric layer 14 is formed over the semiconductor substrate 2. The first dielectric layer 4 is preferably formed by using suitable material such as borophosphosilicate glass (BPSG), silicon oxide, silicon nitride. Next, a contact hole 16 is formed in the first dielectric layer 14 by patterning and etching. A first conductive layer 18 is formed over and in the contact hole 16 and on the first dielectric layer 14. The first conductive layer 18 is preferably formed using conventional LPCVD processing. The first conductive layer 18 is preferably either doped polysilicon or in-situ doped polysilicon. A photoresist 20 is patterned on the first conductive layer 1 8 to define the area to form the capacitor.

Figure 2:
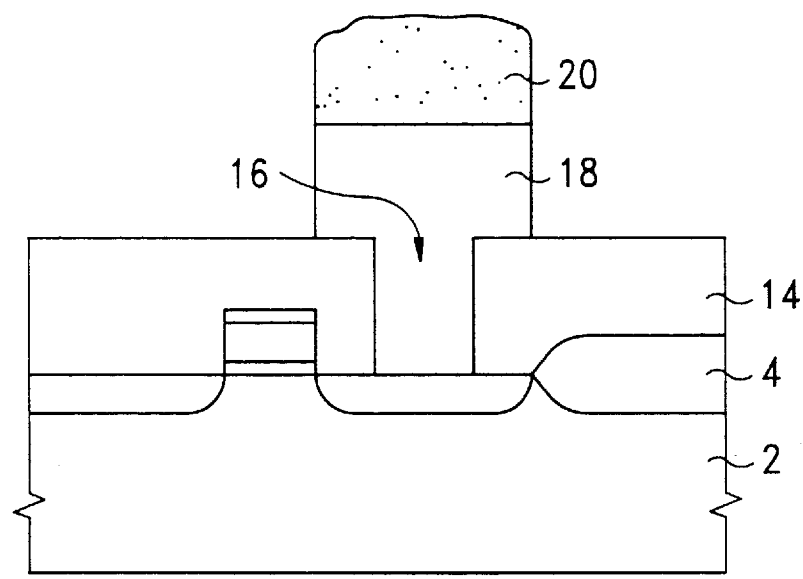
FIG. 2 is a cross section view of a semiconductor wafer illustrating the step of etching the polysilicon layer on the semiconductor substrate according to the present invention.
Figure 3:
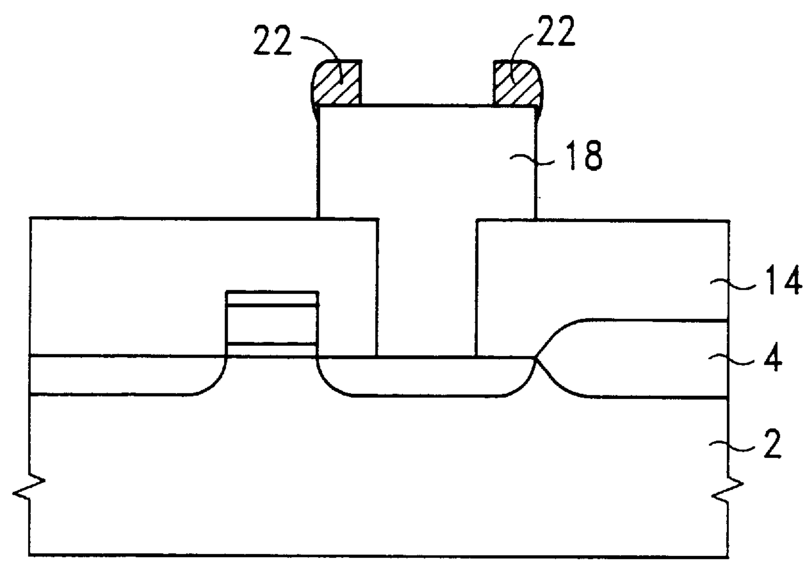
FIG. 3 is a cross section view of a semiconductor wafer illustrating the step of performing an ash according to the present invention.
Figure 3A:
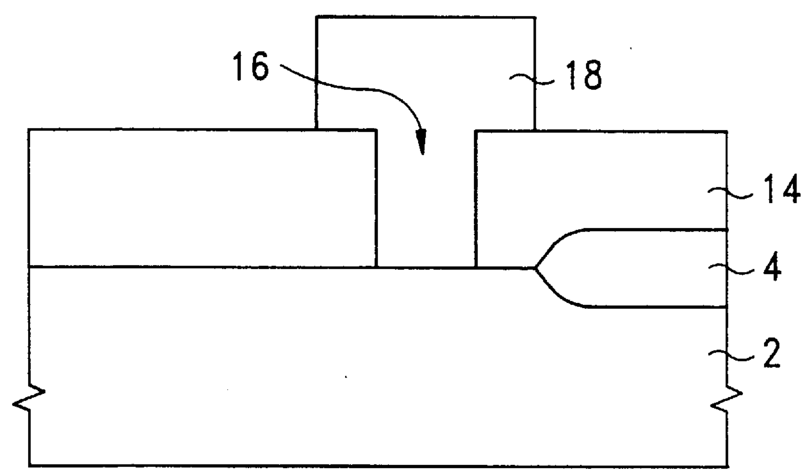
FIG. 3A is a cross section view of a semiconductor wafer illustrating the step of performing a RCA according to the present invention.

Turning to FIG. 2, an etching process is used to etch the polysilicon layer 18 using the photoresist 20 as an etching mask. Residual photoresist 20 is remained on the polysilicon layer 18. Then, see FIG. 3, an ash step is performed to the substrate 2. A plurality of polymers 22 are formed on the patterned polysilicon layer 18 and at the edges of the polysilicon storage node 18. The polymer 22 are by-product of the reaction of the photoresist with the reaction gases. Turning to FIG. 3A, an wet etching step is optionally used to remove the polymers 22 on the patterned polysilicon layer 18 using RCA procedure.

Figure 4:
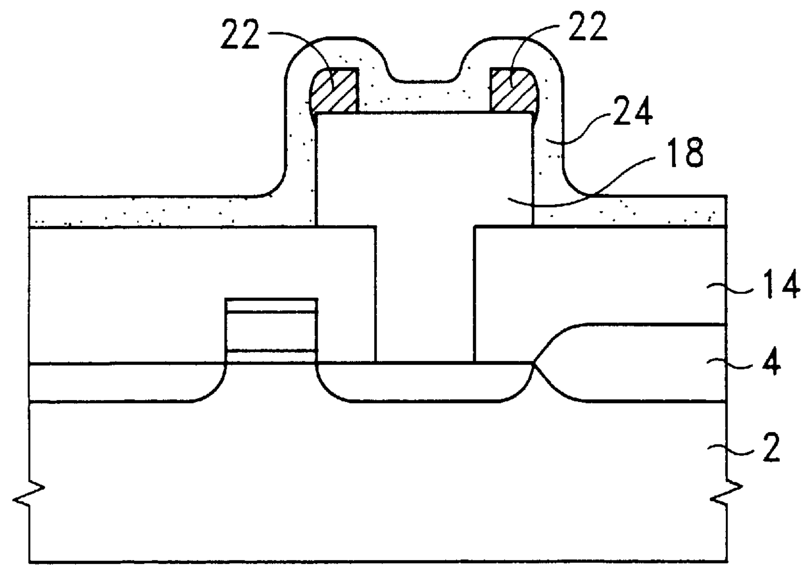
FIG. 4 is a cross section view of a semiconductor wafer illustrating the step of forming an organic layer according to the present invention.

Referring now to FIG. 4, an organic layer 24, such as diluted photoresist or bottom anti- reflective coating (BARC), is formed on the surface of the polysilicon layer 18, and on the polymers 22, if the polymers 22 are remained on the top of the polysilicon layer 18.

Figure 5:
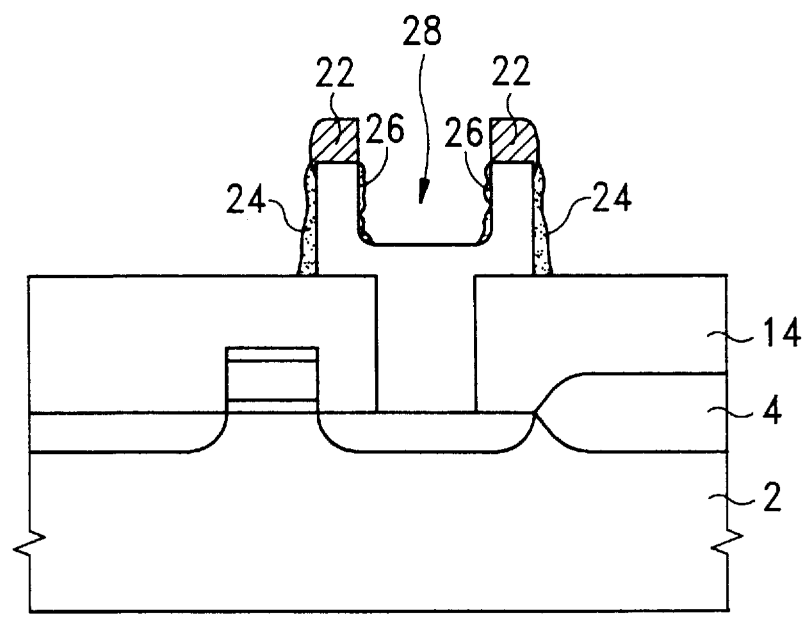
FIG. 5 is a cross section view of a semiconductor wafer illustrating the steps of performing an ash and RCA according to the present invention.

Turning next to FIG. 5, an anisotropically etch is carried out to etch the organic layer 24, thereby forming organic side wall spacers on the side walls of the patterned polysilicon layer 18. Then, an etching is continuously performed to etch the polysilicon layer 18 using the polymers 22 and organic side wall spacers as masks. That is because new polymer 26 will be generated to cover the inner side walls of the polysilicon during the etching. Thus, the polymer, initial polymer 22 and the organic side spacers 24 will protect a portion of the polysilicon layer 18. Therefore, a crown shape capacitor 28 is created. At last, most of the new polymer 26, initial polymer 22 and the organic side spacers 24 are removed by the etching. Only a portion of the materials are remained on the crown shape capacitor 28.

Figure 6:
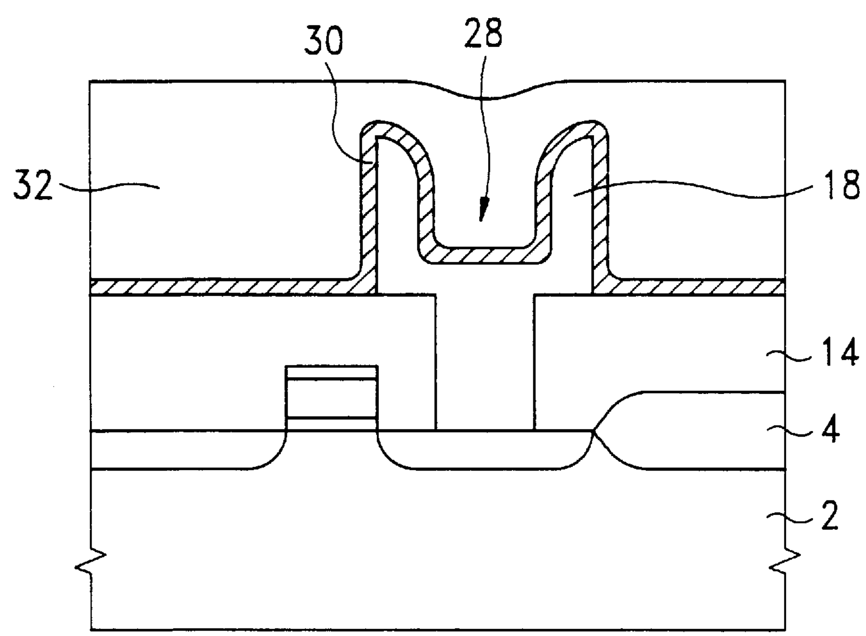
FIG. 6 is a cross section view of a semiconductor wafer illustrating the steps of forming a dielectric layer along the surface of the polysilicon layer, forming a second polysilicon layer on the dielectric layer according to the present invention.

Next, as can be seen by reference to FIG. 6, an ash and a RCA clean procedure are performed to remove the residual polymers 22, 26 and the organic layer 24.The RCA clean procedure can mask the substrate clean without residual polymer or photoresist. A second dielectric layer 30 is then deposited on the surface of the crown shape capacitor 28 formed of polysilicon. The second dielectric layer 30 is preferably formed of either a double film of silicon nitride, silicon oxide film, a triple film of silicon oxide, silicon nitride, silicon oxide or any other high dielectric film such as tantalum oxide ($Ta_2O_5$), BST. After the second dielectric layer 30 is deposited, a second conductive layer 32 is deposited using a conventional LPCVD process over the dielectric layer 30. The second conductive layer 32 provides a second storage electrode and is formed of doped polysilicon, in-situ doped polysilicon, aluminum, copper, tungsten or titanium.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of fabricating a crown shape capacitor over a semiconductor substrate, said method comprising:

forming a polysilicon layer over said semiconductor substrate;

patterning said polysilicon layer, residual photoresist formed on said polysilicon layer;

performing a first ash step to remove said residual photoresist, polymers being formed on said polysilicon layer and at edges of said polysilicon layer;

forming an organic layer on a surface of said polysilicon layer, said polymers;

etching said organic layer to form organic side-wall spacers on side walls of said polysilicon layer, then etching said polysilicon layer using said polymers, said organic side-wall spacers as an etching mask, thereby forming said polysilicon with crown shape structure to act as a first storage node of said capacitor;

performing a second ash step to remove said polymers, said organic side-wall spacers;

forming a dielectric layer on said crown shape structure; and forming a conductive layer over said dielectric layer to act as a second storage node of said capacitor.

2. The method of claim 1, further comprising a step of performing a wet etching to remove said polymers before forming said organic layer.

3. The method of claim 1, wherein said organic layer comprises diluted photoresist.

4. The method of claim 1, wherein said organic layer comprises bottom anti-reflective coating (BARC) layer.

5. The method of claim 1, wherein said polysilicon layer comprises doped polysilicon.

6. The method of claim 1, wherein said polysilicon layer comprises in-situ doped polysilicon.

7. The method of claim 1, wherein said dielectric layer is formed of tantalum oxide ($Ta_2O_5$).

8. The method of claim 1, wherein said dielectric layer is formed of BST.

9. The method of claim 1, wherein said dielectric layer is formed of a triple film of silicon oxide, silicon nitride, silicon oxide.

10. The method of claim 1, wherein said dielectric film is formed of a double film of silicon nitride, silicon oxide.

11. The method of claim 1, wherein said conductive layer comprises doped polysilicon.

12. The method of claim 1, wherein said conductive layer comprises in-situ doped polysilicon.

13. The method of claim 1, wherein said conductive layer is chosen from aluminum, copper, tungsten or titanium.

14. A method of fabricating a crown shape silicon structure, said method comprising:

providing a silicon layer over a semiconductor substrate;

patterning said silicon layer, residual photoresist formed on said silicon layer;

performing a first ash step to remove said residual photoresist, polymers being formed on said silicon layer and at edges of said silicon layer;

forming an organic layer on a surface of said silicon layer, said polymers;

etching said organic layer to form organic side-wall spacers on side walls of said silicon layer, then etching said silicon layer using said polymers, said organic side-wall spacers as an etching mask, thereby forming said crown shape silicon structure; and performing a second ash step to remove said polymers, said organic side-wall spacers.

15. The method of claim 14, further comprising a step of performing a wet etching to remove said polymers before forming said organic layer.

16. The method of claim 14, wherein said organic layer comprises diluted photoresist.

17. The method of claim 14, wherein said organic layer comprises bottom anti-reflective coating (BARC) layer.

18. The method of claim 14, wherein said polysilicon layer comprises doped polysilicon.

19. The method of claim 14, wherein said polysilicon layer comprises in-situ doped polysilicon.

* * * * *